(12) United States Patent
Hung et al.

(10) Patent No.: US 9,881,821 B2
(45) Date of Patent: Jan. 30, 2018

(54) CONTROL WAFER MAKING DEVICE AND METHOD FOR MEASURING AND MONITORING CONTROL WAFER

(71) Applicant: TAIWAN SEMICONDUCTOR MANUFACTURING CO., LTD., Hsinchu (TW)

(72) Inventors: Shih-Wei Hung, Kaohsiung (TW); Chia-Chiung Lo, Taipei (TW); Chien-Feng Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/983,833

(22) Filed: Dec. 30, 2015

(65) Prior Publication Data
US 2017/0194176 A1   Jul. 6, 2017

(51) Int. Cl.
*H01L 21/67* (2006.01)
*G01B 11/06* (2006.01)
*H01L 21/02* (2006.01)
*H01L 21/3065* (2006.01)
*H01L 21/66* (2006.01)

(52) U.S. Cl.
CPC .... *H01L 21/67253* (2013.01); *G01B 11/0641* (2013.01); *H01L 21/02532* (2013.01); *H01L 21/02636* (2013.01); *H01L 21/3065* (2013.01); *H01L 21/67069* (2013.01); *H01L 22/12* (2013.01)

(58) Field of Classification Search
CPC combination set(s) only.
See application file for complete search history.

(56) References Cited

U.S. PATENT DOCUMENTS

| | | | |
|---|---|---|---|
| 2011/0003450 A1* | 1/2011 | Lee | H01L 29/6653 438/285 |
| 2011/0081766 A1* | 4/2011 | Liu | H01L 21/76232 438/424 |
| 2012/0025201 A1* | 2/2012 | Wann | H01L 21/02381 257/76 |
| 2014/0203288 A1* | 7/2014 | Hsiung | H01L 29/7787 257/76 |
| 2014/0256119 A1* | 9/2014 | Tsai | H01L 21/0262 438/507 |
| 2014/0349452 A1* | 11/2014 | Wang | H01L 21/823468 438/238 |
| 2016/0097677 A1* | 4/2016 | Shachaf | G01J 3/28 702/189 |

* cited by examiner

*Primary Examiner* — Kyoung Lee
*Assistant Examiner* — Ratisha Mehta
(74) *Attorney, Agent, or Firm* — Maschoff Brennan

(57) ABSTRACT

A control wafer making device, a method of measuring an epitaxy thickness in a control wafer, and a method for monitoring a control wafer are provided. In various embodiments, the control wafer making device includes a wafer substrate removing element and an epitaxy forming element. In various embodiments, a control wafer includes a substrate, a recess, a blocking layer, and an epitaxy. The substrate has a surface, and the recess is in the surface of the substrate. The blocking layer is over the surface of the substrate other than the recess. The epitaxy is in the recess. In various embodiments, the thickness of the epitaxy of the control wafer is measured by a polarized light.

20 Claims, 8 Drawing Sheets

CONTROL WAFER MAKING DEVICE AND METHOD FOR MEASURING AND MONITORING CONTROL WAFER

BACKGROUND

The semiconductor industry has experienced exponential growth, and has progressed in pursuit of higher device density and performance, and lower costs. Since the fabrication of a semiconductor device is complicated and includes numerous steps, accuracy is a very important issue to each step. Hence, it is crucial to monitor the steps and inspect whether the processing conditions of the steps meet the requirements to ensure the property and/or performance of inline production. By doing so, process errors can be decreased, which lowers the possibility of damage or waste and thereby reducing the cost. However, in current technology, complex procedures are required for monitoring the inline production. Accordingly, the method for monitoring the inline production has to be continuously improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
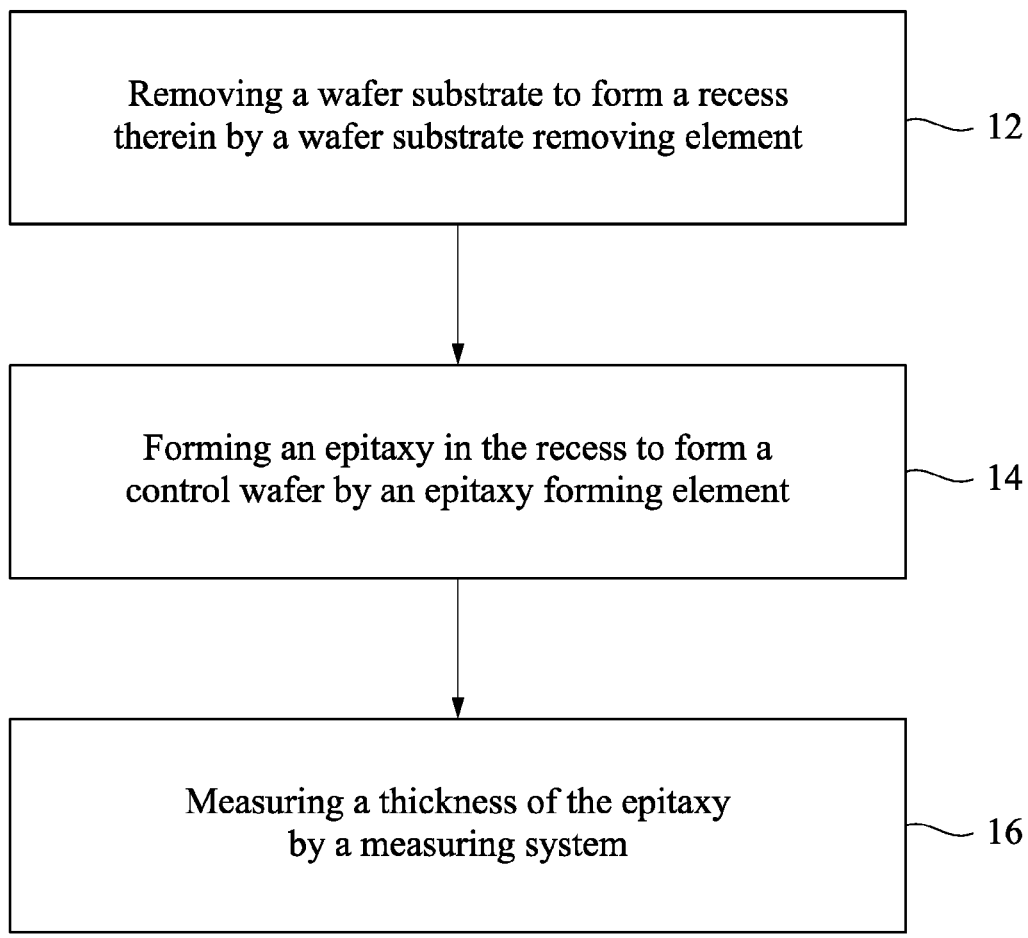
FIG. 1 is an exemplary flow chart of forming a control wafer and measuring a thickness of an epitaxy therein in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, it is crucial to monitor the property and/or performance of inline production accurately. Particularly, an offline control wafer is usually used as simulation of inline production. For instance, a general control wafer is a flat substrate, and an object, such as epitaxy, to be checked is formed over the substrate. However, numerous and complex procedures has to be conducted in general monitoring method to check the property and/or performance of the object. Some of the procedures are destructive physical analysis, such as transmission electron microscopy (TEM). Further, if the object is multi-layered, only the property and/or performance of the whole object on the flat control wafer can be checked at a time. This is because that a real inline multi-layered film cannot be grown on a control wafer but a single-layered film. Because the film in the control wafer has no loading effect as same as a film in a pattern wafer, thus leading to a poor structure of the film in the control wafer. In addition, since there is no multi-layered film in a control wafer, there is no measuring method for measuring a plurality of thickness of the layers of the multiple-layered film in the control wafer as well. Therefore, excessive control wafers are required to obtain highly accurate simulation results, which is time-consuming and costly.

In order to solve the above-mentioned problems, the present disclosure provides a control wafer making device, a method of measuring an epitaxy thickness in a control wafer, and a method for monitoring a control wafer, which is beneficial for simulation of inline production with high accuracy and low cost, and is time saving.

Now, referring to FIG. 1, which shows an exemplary flow chart of a method 10 for forming a control wafer and measuring a thickness of an epitaxy therein according to the disclosure, the method 10 including: forming a recess in a substrate (step 12); forming an epitaxy in the recess to form a control wafer (step 14); and measuring a thickness of the epitaxy (step 16). The step 12 and step 14 are related to formation of a control wafer, while the step 16 is related to measurement of an epitaxy of the control wafer. The related manufacturing elements of control wafer making devices for making a control wafer and measuring elements are shown in FIG. 3A through FIG. 3D. Furthermore, the cross sectional views of a control wafer at different stages during of manufacturing process are shown in FIG. 4A through 4D and FIG. 5. In the disclosure, the control wafer making device comprises two control wafer making devices 1000 and 2000, having a difference in epitaxy forming element and measuring element, which will be discussed latter. Now, the control wafer making device 1000 and the control wafer 100 are discussed first in the following.

Figure 2:
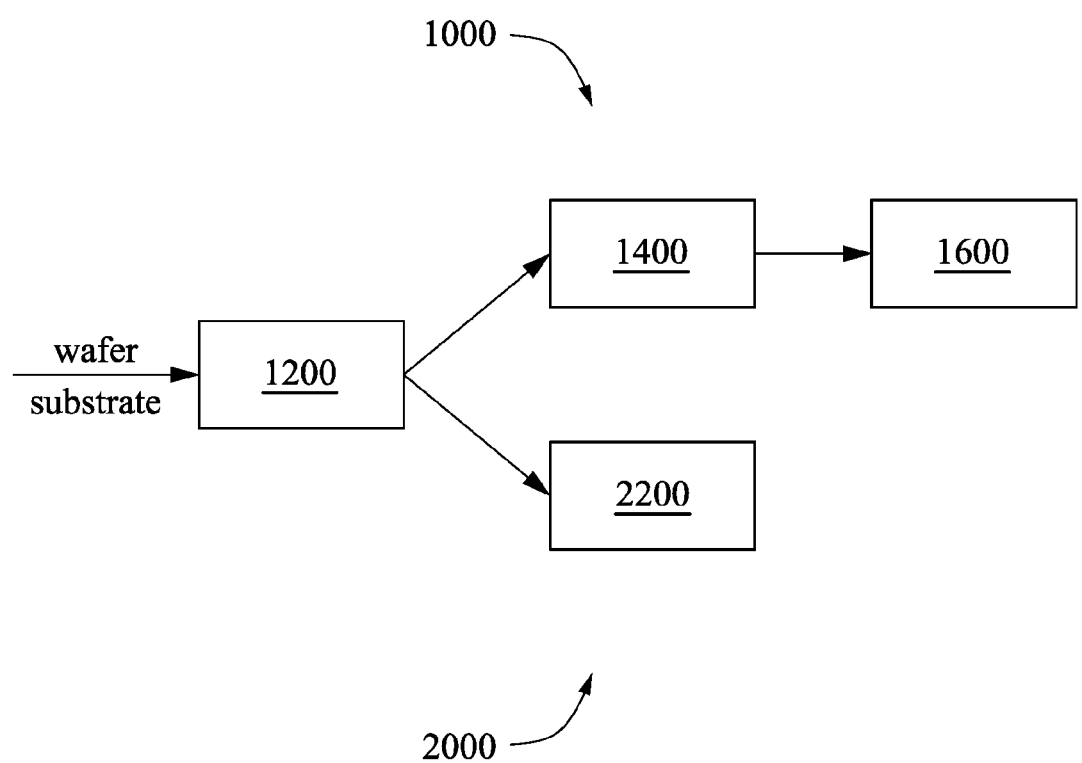
FIG. 2 is an overview of control wafer making devices in accordance with some embodiments.
Figure 3A:
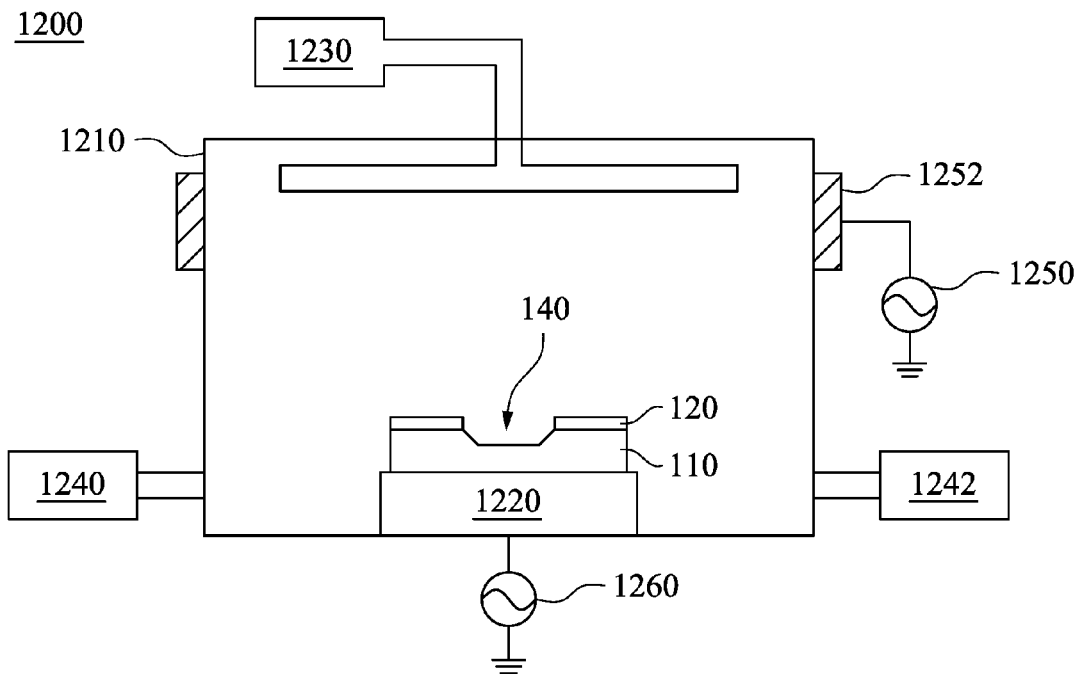
FIGS. 3A through 3D are elements of control wafer making devices in accordance with some embodiments.

Referring to FIG. 1 and FIG. 2, the method 10 starts from step 12 by removing a wafer substrate to form a recess therein by a wafer substrate removing element 1200. The wafer substrate removing element 1200 of a control wafer making device 1000 is shown in FIG. 3A. In the embodiment, the wafer substrate removing element 1200 comprise an entire chamber. In another embodiment, the wafer substrate removing element 1200 is only a part of an inline chamber and/or an offline chamber. The wafer substrate removing element 1200 may comprise, but not limited to, a chamber 1210, a control wafer holding stage 1220, a vacuum pump 1240 to make the chamber 1210 vacuum, a second pump 1242 to remove residual material etched away from the wafer substrate, an etching gas providing device 1230, a plasma making device 1250, an antenna 1252 to connect the plasma making device 1250 to the chamber 1210, and a RF power 1260. One with skilled art may know a function of these structures of the substrate removing element 1200 and other suitable structures which can be added additionally. As a result, the instruction and detailed operation of these structures may not be discussed in the following statement. In other words, the following statement will focus on formation and structure of a control wafer.

Figure 4A:
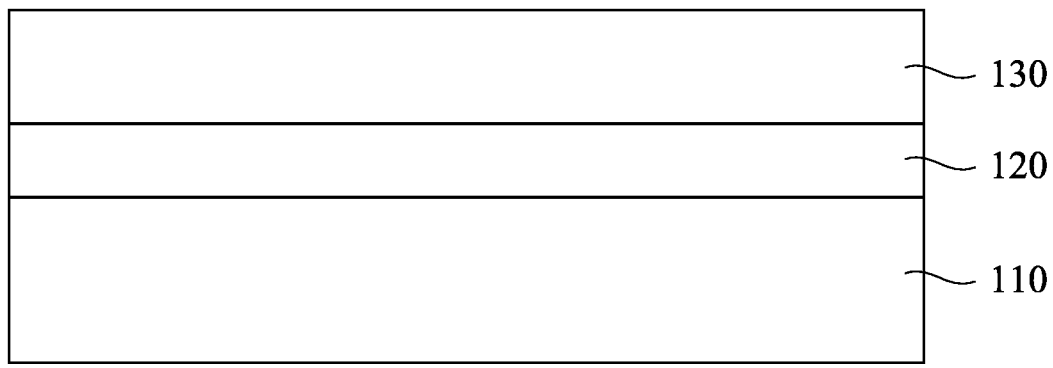
FIGS. 4A through 4D are cross-sectional views at various stages of fabricating a control wafer in accordance with some embodiments.

Before step 12 of removing a substrate 110 to form a recess therein, a substrate 110 may be deposited with a blocking layer 120 and a photoresist layer 130 and then patterned to form a photoresist mask 130a by other manufacturing elements in other chambers. Referring to FIG. 4A, a blocking layer 120 is deposited over a surface of a substrate 110. A photoresist layer 130 is formed over the blocking layer 120. The photoresist layer 130 may be a two-layer or tri-layer photoresist depending on actual requirements.

In some embodiments, the substrate 110 is a bulk substrate or a semiconductor-on-insulator (SOI) substrate. Examples of the material of the substrate 110 include but are not limited to silicon, silicon germanium, silicon carbide, gallium arsenic, gallium phosphide, indium phosphide, indium arsenide, indium antimonide, or a combination thereof. In some embodiments, the substrate 110 is made of silicon, silicon nitride, silicon oxide, or a combination thereof.

The blocking layer 120 may be formed by any suitable depositing process. Examples of the depositing process include but are not limited to chemical vapor deposition (CVD), atmospheric pressure chemical vapor deposition (APCVD), low pressure chemical vapor deposition (LPCVD), plasma enhanced chemical vapor deposition (PECVD), metal-organic chemical vapor deposition (MOCVD), physical vapor deposition (PVD), atomic layer deposition (ALD), chemical solution deposition, sputtering, and a combination thereof. In some embodiments, the blocking layer 120 is formed by atomic layer deposition. A polishing process may be performed after the deposition to planarize an upper surface of the blocking layer 120. In some embodiments, the polishing process includes a chemical-mechanical-polishing (CMP) process. The blocking layer 120 may be made of a dielectric material. Examples of the dielectric material includes but are not limited to silicon oxide, silicon nitride, silicon oxynitride, fluoride-doped silicate glass, a low-k dielectric material, and a combination thereof. In some embodiments, the blocking layer 120 is made of silicon nitride having a formula of $Si_3N_4$.

Figure 4B:
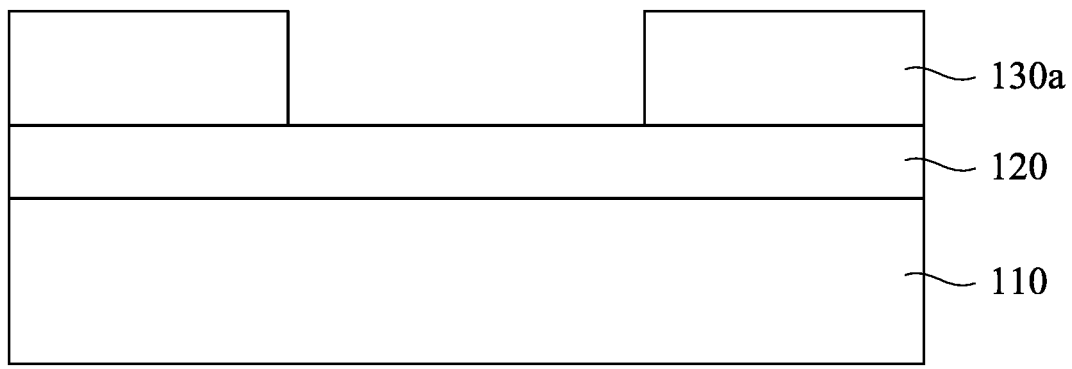

Continuing in FIG. 4B, the photoresist layer 130 is patterned to form a photoresist mask 130a over the blocking layer 120. The photoresist mask 130a may be formed by exposing the photoresist layer 130 to form a pattern, performing post-exposure bake processes, and developing the pattern to form the photoresist mask 130a. In some embodiments, the photoresist mask 130a has an open ratio in a range from about 7% to about 28%, which means that about 7% to about 28% of a surface of the blocking layer 120 is exposed. For instance, the open ratio of the photoresist mask 130a is equal to or smaller than 8%.

Figure 4C:
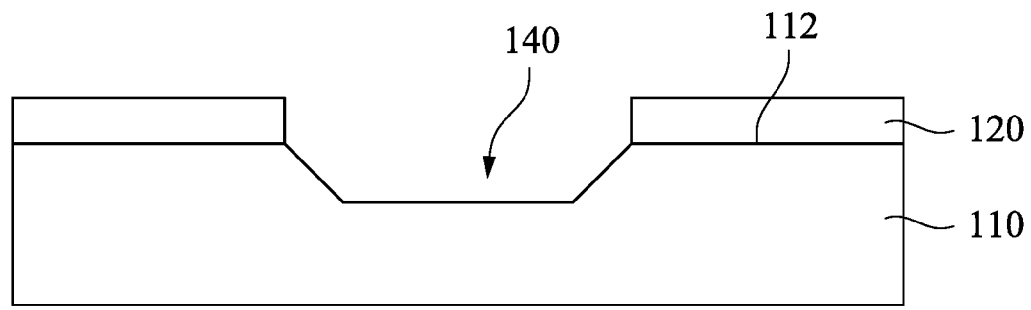

After the blocking layer 120 and photoresist mask 130a are formed on the substrate 110 as shown in FIG. 4B, the substrate 110 is moved to the wafer substrate removing element 1200 as shown in FIG. 3A to remove a portion of the substrate 110 and a portion of the blocking layer 120 to form a recess 140 in the surface 112 of the substrate 110. As shown in FIG. 4C, the removed portions of the substrate 110 and the blocking layer 120 are defined by the photoresist mask 130a. The portions of the substrate 110 and the blocking layer 120 may be removed by an etching process, such as dry etching and wet etching. After the recess 140 is formed, the photoresist mask 130a is removed.

In the embodiments that the photoresist mask 130a has an open ratio in a range from about 7% to about 28%, the exposed blocking layer 120 is removed. That is, about 7% to about 28% of the surface 112 of the substrate 110 is exposed, and the recess 140 is formed in the exposed surface of the substrate 110. The blocking layer 120 may cover about 72% to about 93% of the surface 112 of the substrate 110. In some embodiments, the blocking layer 120 covers about 92% or more of the surface 112 of the substrate 110. In some embodiments, the blocking layer 120 has a thickness in a range from about 3 nm to about 50 nm.

The recess 140 may have a depth in a range from about 30 nm to about 350 nm. In some embodiments, the recess has a depth equal to or greater than about 110 nm. In some embodiments, the recess 140 has an inverted trapezoidal profile as shown in FIG. 4C.

Figure 3B:
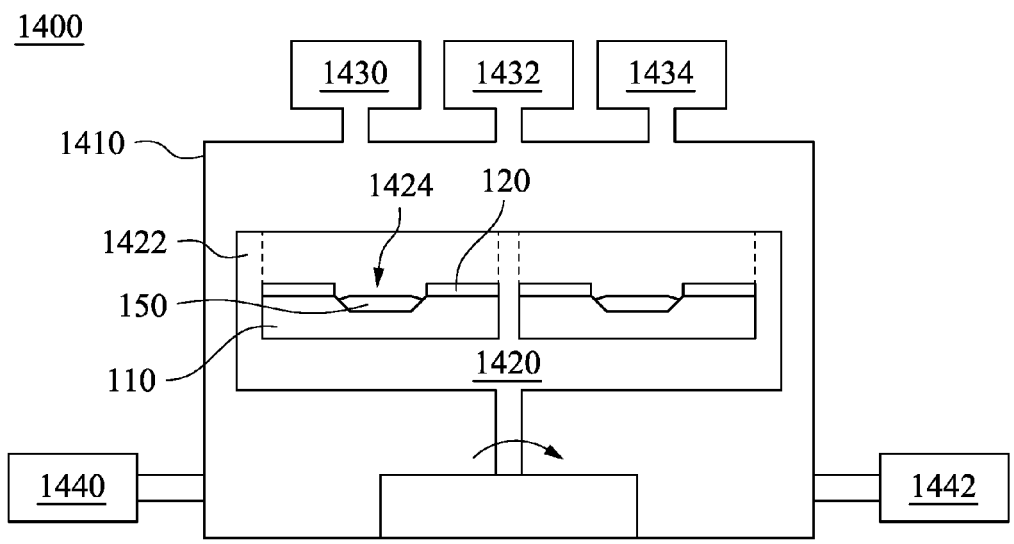

Referring to FIG. 1 and FIG. 2, the method 10 proceeds to step 14 by forming an epitaxy in the recess to form a control wafer by an epitaxy forming element 1400. The epitaxy forming element 1400 of a control wafer making device 1000 is shown in FIG. 3B. In the embodiment, the epitaxy forming element 1400 comprise an entire chamber. In other embodiments, the epitaxy forming element 1400 is only a part of an inline chamber and/or an offline chamber. The epitaxy forming element 1400 may comprise, but not limited to, a chamber 1410, a rotating control wafer holding stage 1420, an optional fixed mask 1422 over the rotating control wafer holding stage 1420 and with an opening 1424 therein, a vacuum pump 1440 to make the chamber 1410 vacuum, a second pump 1442 to remove residual material from the chamber 1410 when growing an expitaxy, and an reaction gas providing device 1430, 1432, and 1434. It should be noticed that the epitaxy forming element 1400 may comprise other elements, such as a heater element. One with skilled art may know a function of these structures of the epitaxy forming element 1400 and other suitable structures which can be added additionally. As a result, the instruction and detailed operation of these structures may not be discussed in the following statement. In other words, the following statement will focus on formation of an epitaxy of a control wafer.

Figure 4D:
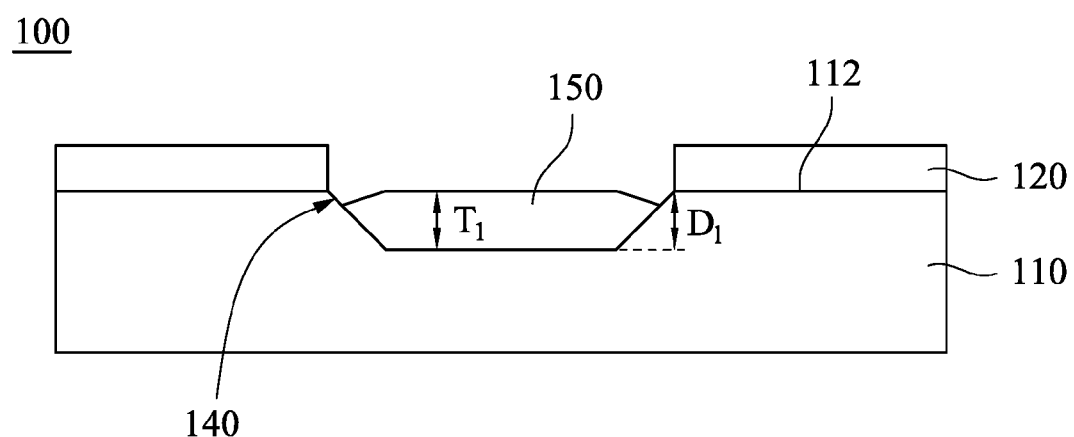

After the recess 140 is formed in the substrate 110 as shown in FIG. 4C, the substrate 110 is moved to the epitaxy forming element 1400 as shown in FIG. 3B for a subsequent epitaxy forming process. As shown in FIG. 4D, an epitaxy 150 is formed in the recess 140. Accordingly, the control wafer 100 is thereby formed.

In some embodiments, the blocking layer 120 completely covers the surface 112 of the substrate 110 other than the recess 140 as shown in FIG. 4D. In other embodiments, the blocking layer 120 partially covers the surface 112 of the substrate 110 other than the recess 140.

The epitaxy 150 may partially or completely occupy the recess 140, which may be determined by controlling the etching conditions of the recess 140 and the forming conditions of the epitaxy 150. In some embodiments, a thickness $T_1$ of the epitaxy 150 and a depth $D_1$ of the recess 140 have a ratio in a range from about 1:1 to about 1:5. It is noteworthy that the recess 140 cannot be too shallow, or the epitaxy 150 might be formed out of the recess 140, resulting in the loss of the property of the epitaxy 150. Further, the recess 140 cannot be too deep, or it might be difficult to grow high quality epitaxial film, and the formed epitaxy 150 might have a poor structure. In some embodiments, the epitaxy 150 has a thickness in a range from about 30 nm to about 70 nm. The epitaxy 150 may have a diamond shape as shown in FIG. 1D. The epitaxy 150 may be p-type or n-type depending on actual requirement.

In some embodiments, the epitaxy 150 is grown by an epitaxy process including a Si-containing gas (e.g., silane or dichlorosilane (DCS)), a Ge-containing gas (e.g., $GeH_4$, $GeCl_4$), a carrier gas (e.g., $H_2$), and/or a selective etching gas (e.g., HCl). For example, the epitaxy 150 is formed of silicon to increase the strain of a N-channel field effect transistor (NFET) device, and resulting in higher electron mobility during operation of the NFET device. In another example, the epitaxy 150 is formed of silicon germanium to increase the strain of a P-channel field effect transistor (PFET) device, and resulting in higher hole mobility during operation of the PFET device. Further, the epitaxy process may optionally include doping with a dopant, such as boron and phosphorus to form the epitaxy 150. In some embodiments, the epitaxy process is performed under a temperature ranging between about 500° C. and about 800° C., and under a pressure ranging between about 10 Torr and about 100 Torr. The epitaxy 150 may be made of silicon (Si), germanium (Ge), boron (B), phosphorus (P), or a combination thereof. In some embodiments, the epitaxy 150 is made of boron-doped silicon germanium (SiGeB).

It is noteworthy that the foregoing operating sequences and/or conditions for the method for forming the control wafer 100 shown in FIGS. 4A thorough 4D are merely examples and are not intended to be limiting, and various changes, substitutions, and alterations may be made without departing from the spirit and scope of the present disclosure.

The formed control wafer 100 includes the substrate 110, the recess 140, the blocking layer 120, and the epitaxy 150. The substrate 110 has the surface 112, and the recess 140 is in the surface 112 of the substrate 110. The blocking layer 120 is over the surface 112 of the substrate 110 other than the recess 140. That is, the blocking layer 120 does not cover the recess 140. The epitaxy 150 is in the recess 140.

A general control wafer is a flat substrate having an open ratio of 100%, also called a blanket wafer, which leads to poor formation of an epitaxy over the flat substrate. As a result, the property and/or the performance of the poorly formed epitaxy cannot be accurately checked. In contrast, the control wafer 100 in accordance with some embodiments of the present disclosure applies the recess 140 in the surface 112 of the substrate 110, and the epitaxy 150 is formed in the recess 140. The recess 140 is a relatively small area comparing to the whole surface 112 of the substrate 110, and therefore the structure of the epitaxy 150 is well grown in the recess 140. According, the control wafer 100 is used as simulation of inline production, and the property and the performance of which can be checked using the offline control wafer 100 with high accuracy. In some embodiments, the epitaxy 150 is used as a simulation of an epitaxy for a source/drain region in inline production. In some embodiments, the blocking layer 120 is used as a simulation of sidewalls of a gate in inline production.

Figure 5:
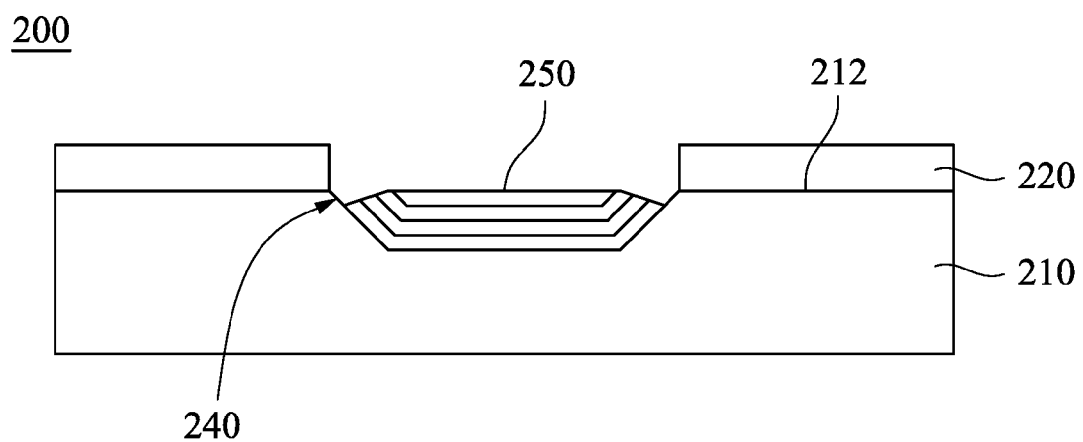
FIG. 5 is a cross-sectional view of a control wafer in accordance with some embodiments.

It is noteworthy that the epitaxy may be a single-layer structure or a multi-layer structure depending on actual requirement, such as electrical properties. For instance, FIG. 5 shows a cross-sectional view of a control wafer 200 in accordance with some embodiments, and an epitaxy 250 of the control wafer 200 is a multi-layer structure. The control wafer 200 includes the substrate 210, the recess 240, the blocking layer 220, and the epitaxy 250. The substrate 210 has the surface 212, and the recess 240 is in the surface 212 of the substrate 210. The blocking layer 220 is over the surface 212 of the substrate 210 other than the recess 240. That is, the blocking layer 220 does not cover the recess 240. The epitaxy 250 is in the recess 240, and is multi-layered. For instance, the epitaxy 250 has four layers as shown in FIG. 5.

The substrate 210 may be made of a bulk material, such as silicon, silicon nitride, silicon oxide, and a combination thereof. The recess 240 may have a depth in a range from about 30 nm to about 350 nm. In some embodiments, the recess 240 has an inverted trapezoidal profile as shown in FIG. 5.

The blocking layer 220 may partially or completely cover the surface 212 of the substrate 210 other than the recess 240. The blocking layer 220 may cover about 72% to about 93% of the surface 212 of the substrate 210, which means that about 7% to about 28% of the surface 212 of the substrate 210 may be exposed. In some embodiments, the blocking layer 220 covers about 92% or more of the surface 212 of the substrate 210, i.e., about 8% or less of the surface 212 of the substrate 210 is exposed. The blocking layer 220 may have a thickness in a range from about 3 nm to about 50 nm. In some embodiments, the blocking layer 220 is made of a dielectric material, such as silicon nitride ($Si_3N_4$).

The epitaxy 250 may partially or completely occupy the recess 240. In some embodiments, a thickness of the epitaxy 250 and a depth of the recess 240 have a ratio in a range from about 1:1 to about 1:5. The recess 240 may have a depth in a range from about 30 nm to about 350 nm. The epitaxy 250 may have a thickness in a range from about 30 nm to about 70 nm. Examples of the material of the epitaxy include but are not limited to silicon, germanium, boron, phosphorus, and a combination thereof. In some embodiments, the epitaxy 250 is p-type epitaxy, and is made of boron-doped silicon germanium (SiGeB).

It is noteworthy that the epitaxy 250 is multi-layered considering electrical properties. As described above, the blanket wafer would lead to poor formation of the epitaxy over the flat substrate. Further, if the epitaxy is multi-layered, no peak can be observed while measuring the property of the epitaxy on the blanket wafer by secondary ion mass spectrometer (SIMS), and only noise can be observed. This is because the blanket wafer has no loading effect. As a result, the property and/or the performance of the poorly formed epitaxy cannot be accurately checked, and the boundaries between each layer of the multi-layered epitaxy cannot be observed. In contrast, the control wafer 200 in accordance with some embodiments of the present disclosure applies the recess 240, which is a relatively small area comparing to the whole surface 212 of the substrate 210. Therefore, the structure of the epitaxy 250 is well grown in the recess 240, and the boundaries between each layer of the epitaxy 250 can be observed. Accordingly, peaks can be observed while measuring the epitaxy 250 in the recess 240 of the control wafer 200 by SIMS, and the property of the epitaxy 250 can be thereby identified.

The control wafer 200 may be formed by a method similar to that shown in FIGS. 4A through 4D. Other detail features such as materials, forming manners, and other conditions of the substrate 210, the surface 212, the blocking layer 220, the recess 240, and the epitaxy 250 may be referred to those exemplified for the counterparts in FIGS. 4A through 4D.

The difference between the control wafer 200 shown in FIG. 5 and the control wafer 100 shown in FIG. 4D is the number of the layer of the epitaxy. Specifically, the epitaxy 250 of the control wafer 200 is multi-layered, while the epitaxy 150 of the control wafer 100 is single-layered. This difference does not affect the functions of other components in the embodiments. Therefore, the control wafer 200 shown in FIG. 5 has the same functions and advantages as the control wafer 100 shown in FIG. 4D. According, the control wafer 200 can be used as simulation of inline production, and the property and the performance of which can be checked using the offline control wafer 200 with high accuracy. In some embodiments, the epitaxy 250, which is a multi-layer structure, is used as a simulation of an epitaxy for a source/drain region in inline production. In some embodiments, the blocking layer 220 is used as a simulation of sidewalls of a gate in inline production.

Figure 3C:
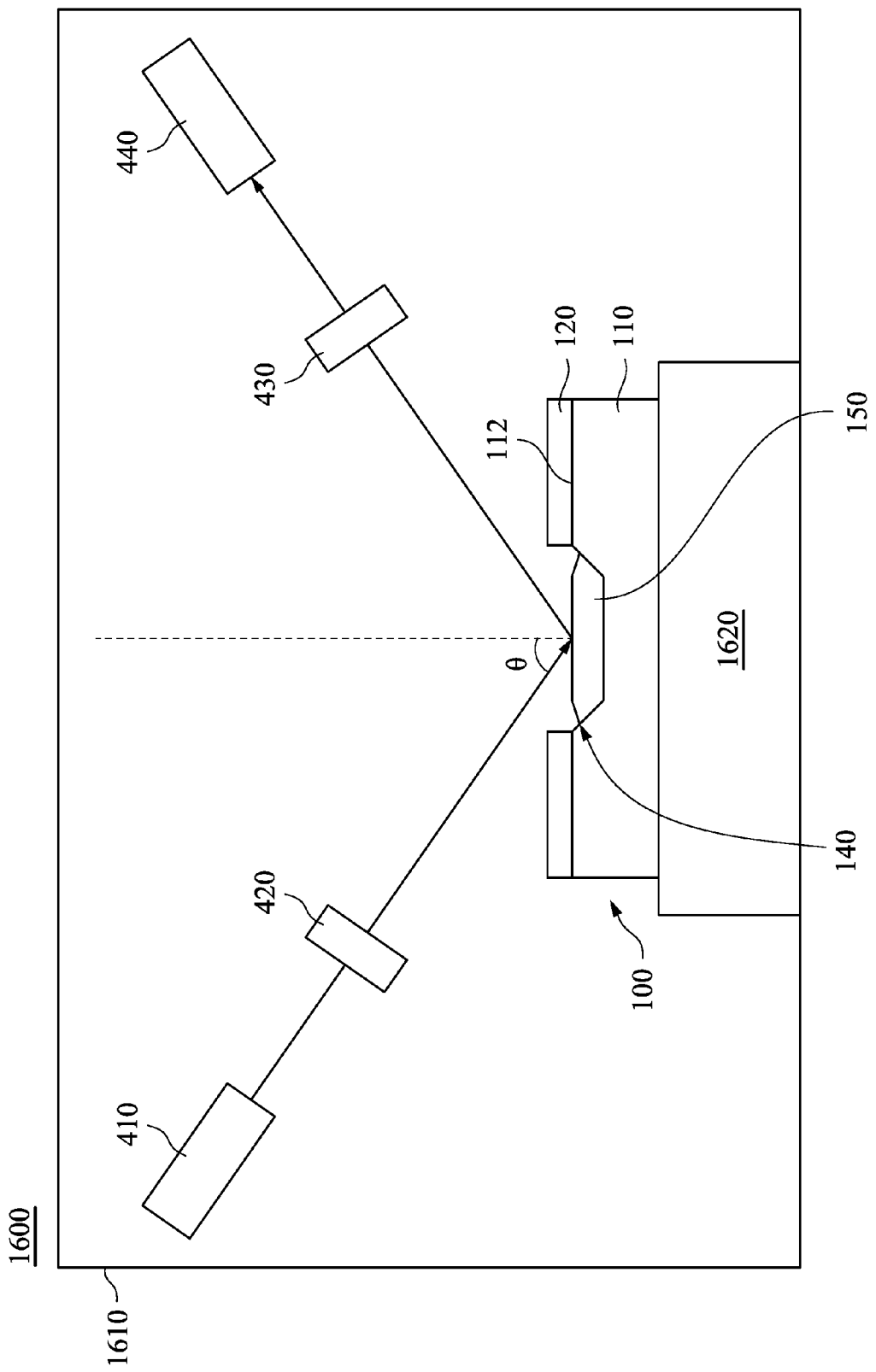

Referring to FIG. 1 and FIG. 2, the method 10 proceeds to step 16 by measuring a thickness of the epitaxy 150 of the control wafer 100 by a measuring element. The measuring element 1600 of a control wafer making device 1000 is shown in FIG. 3C. In the embodiment, the measuring element 1600 comprises an entire chamber. In other embodiments, the measuring element 1600 is only a part of an inline chamber and/or an offline chamber. The measuring element 1600 may comprise, but not limited to, a chamber 1610, a control wafer holding stage 1620, a light source 410, a polarizer 420, an analyzer 430, and a detector 440. It should be noticed that the measuring element 1600 may comprise other elements, such as a compensator between the polarizer 420 and the control wafer holding stage 1620 and/or the between control wafer holding stage 1620 and the analyzer 430. One with skilled art may know a function of these structures of the epitaxy forming element 1400 and other suitable structures which can be added additionally. As a result, the instruction and detailed operation of these structures may not be discussed in the following statement. In other words, the following statement will focus on measurement of an epitaxy of a control wafer.

After the control wafer 100 is formed as shown in FIG. 4D, the control wafer 100 is moved to the measuring element 1600 as shown in FIG. 3C and mentioned above for subsequent measuring process. The thickness of the epitaxy 150 of the control wafer 100 is measured by a polarized light. In some embodiments, the thickness of the epitaxy is measured by ellipsometry. Ellipsometry is an optical technique for investigating properties of thin films, and can be used to characterize thickness or depth. The change in polarization is used as a signal after an incident light interacting with the material structure of the epitaxy. This is because that the polarization change depends on the thickness of the epitaxy. In some embodiments, the thickness of the epitaxy is measured by an ellipsometer. The step 16 of the method 10 applies the polarized light to achieve contact free determination of thickness of the epitaxy.

It is noteworthy that the control wafer monitored by the method 300 may be the control wafer 100 or the control wafer 200 described above. Hence, the detail features such as materials, forming manners, and other conditions of each component may be referred to those exemplified above.

In other embodiments, instead of forming a control wafer according to the steps 12 and 14 mentioned above, the step 16 of the method 10 measures a thickness of an epitaxy of a received control wafer. The received control wafer also includes a substrate, a recess, a blocking layer, and an epitaxy. The substrate has a surface, and the recess is in the surface of the substrate. The blocking layer is over the surface of the substrate other than the recess. The epitaxy is in the recess. The blocking layer may cover about 72% to about 93% of the surface of the substrate, which means that about 7% to about 28% of the surface of the substrate may be exposed. In some embodiments, the blocking layer covers about 92% or more of the surface of the substrate.

In some embodiments, measuring the thickness of the epitaxy in thestep 16 includes the following steps. The epitaxy is irradiated with an incident light. Next, a reflected light from the epitaxy is detected. Then, a polarization change between the incident light and the reflected light is quantified to obtain the thickness of the epitaxy.

The epitaxy may partially or completely occupy the recess. In some embodiments, the epitaxy has a diamond shape, and the recess has an inverted trapezoidal profile. A thickness of the epitaxy and a depth of the recess may have a ratio in a range from about 1:1 to about 1:5. In some embodiments, the recess has a depth in a range from about 30 nm to about 350 nm. In some embodiments, the epitaxy has a thickness in a range from about 30 nm to about 70 nm.

The step 16 of the method 10 can also be used in monitoring the control wafer in accordance with some embodiments of the present disclosure. The method 10 applies the polarized light to measure the thickness of the epitaxy, which is in the recess of the control wafer in accordance with some embodiments of the present disclosure. By doing so, the thickness of each layer of the epitaxy can be obtained, and a none-destructive measurement can be achieved. Further, the step 16 of the method 10 simply applies the polarized light to obtain the thickness of each layer of the epitaxy without complex procedures, which reduces the monitoring time on the control wafer. By cooperating with the control wafer in accordance with some embodiments of the present disclosure, the step 16 of the method 10 provides a simple, low-cost, and rapid methodology for monitoring the control wafer.

The details of measuring the thickness of the epitaxy by the polarized light are described in the following with reference to the measuring element 1600 as shown in FIG. 3C.

As shown in FIG. 3C, an incident light is emitted by a light source 410, and is polarized by a polarizer 420. The polarized incident light may optionally pass through a first compensator. Then, the polarized incident light falls onto the epitaxy 150 for irradiation with an incident angle θ. In some embodiments, the incident light is electromagnetic wave.

Then, the polarized incident light is emitted by the epitaxy 150 after an interaction between the incident light and the epitaxy 150. The interaction may comprise reflection, absorption, scattering, and a combination thereof. After the interaction, the emitted light (or electromagnetic wave) may comprise a reflected light, scattering light, auger electron, secondary electron, and a combination thereof depending on a type of the interaction. It should be noticed that different types of the emitted light may be analyzed by different ways to obtain certain information about the epitaxy 150. In the embodiment, for example, the reflected light emitted from the epitaxy 150 may provide information related to a thickness of the epitaxy 150 in particular. The polarization of the reflected light is changed due to the property, thickness for example, of the epitaxy 150. After reflection, the reflected light may optionally pass through a second compensator. Next, the reflected light passes through and polarized by an analyzer 430, and falls into a detector 440. In some embodiments, the analyzer 430 is another polarizer. Then, the polarization change between the incident light and the reflected light is acquired and quantified to obtain the thickness of the epitaxy 150. By applying the polarized light, the thickness of the epitaxy 150 can be accurately measured without destructing the structure of the epitaxy 150.

The method shown in FIG. 3C for monitoring the control wafer 100 is a simple, low-cost, and rapid methodology for monitoring the control wafer, which applies the polarized light to measure the thickness of the epitaxy 150 in the recess 140 of the control wafer 100. Accordingly, the thickness of each layer of the epitaxy 150 can be measured without destructing the structure of the epitaxy 150 by a simple process.

It is noteworthy that the method for monitoring the control wafer shown in FIGS. 1, 2 and 3C can be used in monitoring the control wafer 200, which includes the multi-layered epitaxy 250. As described above, the structure of the epitaxy 250 can be well grown in the recess 240, and the boundaries between each layer of the epitaxy 250 can be observed. The boundaries between each layer can be observed represents that the thickness of each layer of the epitaxy 250 can be obtained by a single control wafer 200. Therefore, the usage of the control wafer and the monitor cycle time can be reduced by the improved structure of the control wafer and the monitoring method thereof in accordance with some embodiments of the present disclosure.

Figure 3D:
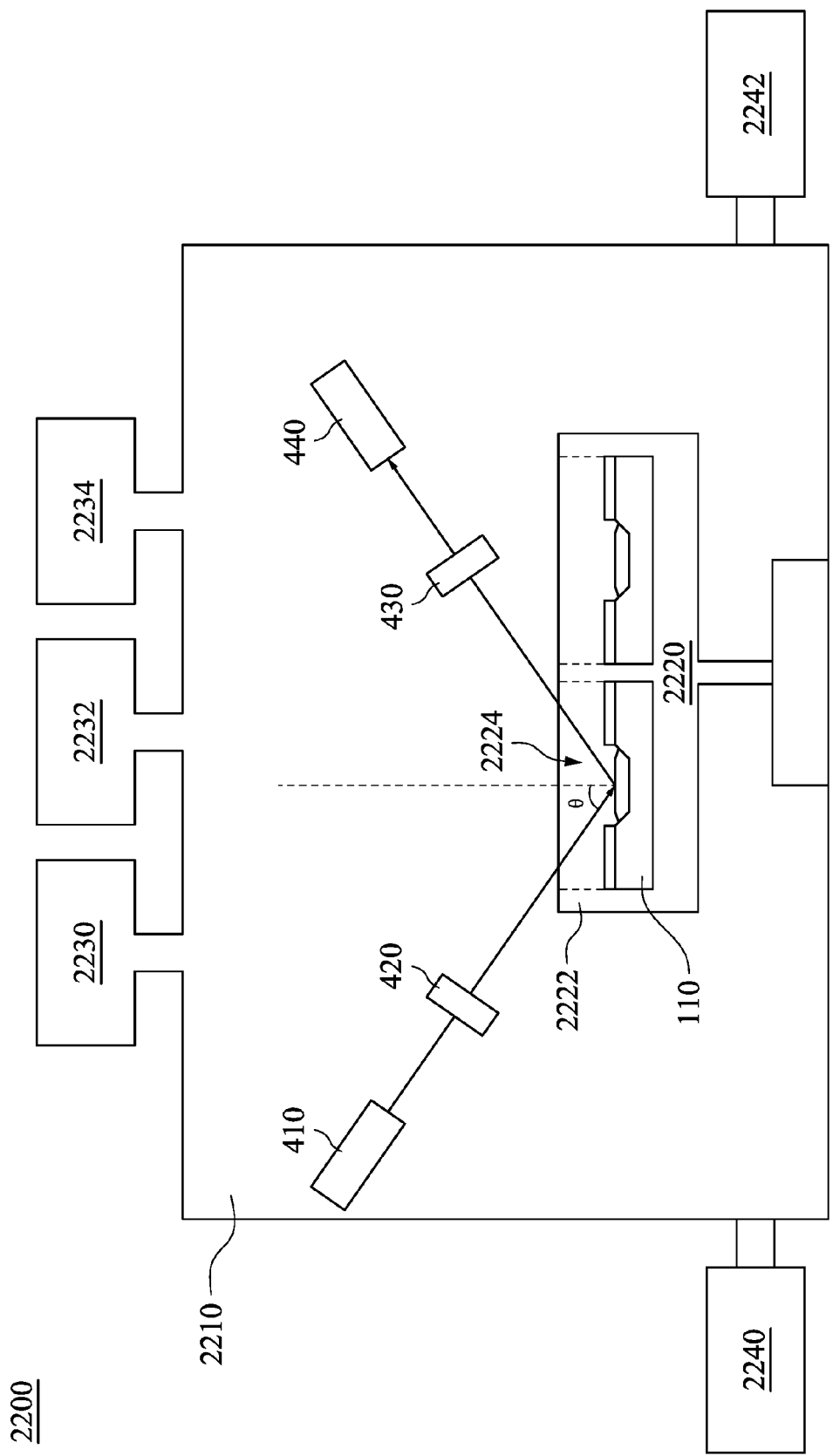

In another embodiment, another control wafer making device 2000 is shown in FIG. 2. The control wafer making device 2000 comprises a wafer substrate removing element 1200 as same as the wafer substrate removing element 1200 in the control wafer making device 1000. Furthermore, the control wafer making device 2000 comprise an epitaxy forming-measuring element 2200. The epitaxy forming-measuring element 2200 is shown in FIG. 3D, which may comprise the epitaxy forming element 1400 and the measuring element 1600 of the control wafer making device 1000. That is to say, the measuring element 1600 is incorporated into the epitaxy forming element 1400 to provide a thickness measurement at the same time of or right after the formation of the epitaxy 150 at the same chamber.

In the embodiment, the epitaxy forming-measuring element 2200 may comprise, but not limited to, a chamber 2210, a rotating control wafer holding stage 2220, an optional fixed mask 2222 over the rotating control wafer holding stage 2220 and with an opening 2224 therein, a vacuum pump 2240 to make the chamber 2210 vacuum, a second pump 2242 to remove residual material from the chamber 2210 when growing an expitaxy, and a reaction gas providing device 2230, 2232, and 2234, a light source 410, a polarizer 420, an analyzer 430, and a detector 440. It should be noticed that the epitaxy forming-measuring element 2200 may comprise other elements, such as a compensator between the polarizer 420 and the rotating control wafer holding stage 2220 and/or the between the rotating control wafer holding stage 2220 and the analyzer 430. One with skilled art may know a function of these structures of the epitaxy forming-measuring element 200 and other suitable structures which can be added additionally.

The description of manufacturing a control wafer and measuring a thickness of an epitaxy of the control wafer is similar to the aforementioned control wafer making device 1000. It should be noticed that, the control wafer making device 2000, in particularly the epitaxy forming-measuring element 2200, may provide a faster measurement of a control wafer because there is no more moving step of a control wafer or waiting period between step 14 and step 16. Furthermore, the epitaxy forming-measuring element 2200 may also applied in inline production for real-time measurement to provide instant information or simulation of the inline wafer or chip.

Given the above, the embodiments of the present disclosure discussed above have advantages over exiting methods and systems. The control wafer in accordance with some embodiments of the present disclosure includes the recess with small exposed ratio, which is benefit for the formation of the multiple-layered epitaxy. Therefore, the control wafer is monitored with high accuracy, such that less control wafer is required to be monitored for the purpose of simulating inline production. The method for monitoring a control wafer in accordance with some embodiments of the present disclosure is a low cost, rapid, non-destructive, and highly accuracy methodology, which reduces monitor cycle time and the number of the control wafer used. Further, by using the method in accordance with some embodiments of the present disclosure, a plurality of thickness of layers of the multiple-layered epitaxy in the control wafer are accurately measured simultaneously without destructing the structure to increase the performance and the efficiency for monitoring the control wafer. It is understood, however, that other embodiments may have different advantages, and that no particular advantages is required for all embodiments.

In accordance with some embodiments of the present disclosure, a control wafer making device includes a wafer substrate removing element and an epitaxy forming element. The wafer substrate removing element is configured to etch a wafer substrate and form a recess therein, while the epitaxy forming element is configured to form an epitaxy in the recess to form a control wafer.

In accordance with other embodiments of the present disclosure, a method of measuring an epitaxy thickness in a control wafer includes the following steps. Forming a recess on a surface of the control wafer. Growing an epitaxy in the recess. Irradiating the epitaxy with an incident electromagnetic wave. Receiving an emitted electromagnetic wave from the epitaxy after an interaction of the incident electromagnetic wave and the epitaxy. And calculating a thickness of the epitaxy.

In accordance with yet other embodiments of the present disclosure, a method for monitoring a control wafer includes the following steps. A control wafer is received, which includes a substrate, a recess, a blocking layer, and an epitaxy. The substrate has a surface, and the recess is in the surface of the substrate. The blocking layer is over the surface of the substrate other than the recess. The epitaxy is in the recess. A thickness of the epitaxy is measured by a polarized light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of measuring an epitaxy thickness in a control wafer, the method comprising:
   forming a recess on a surface of the control wafer, wherein the control wafer comprises a substrate;
   growing an epitaxy in the recess;
   irradiating the epitaxy with an incident electromagnetic wave;

receiving an emitted electromagnetic wave from the epitaxy after an interaction of the incident electromagnetic wave and the epitaxy; and calculating a thickness of the epitaxy, wherein the thickness of the epitaxy and a depth of the recess have a ratio in a range from about 1:1 to about 1:5, the thickness of the epitaxy is defined as a distance between a topmost surface of the epitaxy and a bottom surface of the recess, and the depth of the recess is defined as a distance between a surface of the substrate and the bottom surface of the recess.

2. The method of claim 1, wherein the interaction comprises reflection, absorption, scattering, and a combination thereof.

3. The method of claim 2, wherein the emitted electromagnetic wave comprises reflected electromagnetic wave, scattering electromagnetic wave, auger electron, secondary electron, and a combination thereof.

4. The method of claim 3, wherein the emitted electromagnetic wave is reflected electromagnetic wave.

5. The method of claim 1, wherein calculating the thickness of the epitaxy is by quantifying a polarization change between the incident electromagnetic wave and the emitting electromagnetic wave to obtain the thickness of the epitaxy.

6. The method of claim 1, wherein the epitaxy is multi-layered.

7. The method of claim 1, wherein before forming the recess on the surface of the control wafer, the method further comprises:

depositing a blocking layer over the surface of the substrate;

forming a photoresist layer over the blocking layer; and patterning the photoresist layer to form a photoresist mask over the blocking layer, wherein a surface of a portion of the blocking layer is exposed from the photoresist mask.

8. The method of claim 7, wherein forming the recess on the surface of the control wafer comprises removing the portion of the blocking layer to form the recess.

9. The method of claim 1, wherein the recess has an inverted trapezoidal profile.

10. A method for monitoring a control wafer, the method comprising:

receiving a control wafer comprising:

a substrate having a surface;

a recess in the surface of the substrate;

a blocking layer over the surface of the substrate other than the recess; and an epitaxy in the recess; and measuring a thickness of the epitaxy by a polarized light, wherein the thickness of the epitaxy and a depth of the recess have a ratio in a range from about 1:1 to about 1:5, the thickness of the epitaxy is defined as a distance between a topmost surface of the epitaxy and a bottom surface of the recess, and the depth of the recess is defined as a distance between the surface of the substrate and the bottom surface of the recess.

11. The method of claim 10, wherein the blocking layer covers about 72% to about 93% of the surface of the substrate.

12. The method of claim 10, wherein measuring the thickness of the epitaxy comprises:

irradiating the epitaxy with an incident light;

detecting a reflected light from the epitaxy; and quantifying a polarization change between the incident light and the reflected light to obtain the thickness of the epitaxy.

13. The method of claim 12, wherein the incident light is polarized by a polarizer.

14. The method of claim 12, wherein the reflected light is analyzed by an analyzer.

15. The method of claim 10, wherein the thickness of the epitaxy is in a range from about 30 nm to about 70 nm.

16. The method of claim 10, wherein the depth of the recess is in a range from about 30 nm to about 350 nm.

17. The method of claim 10, wherein the epitaxy is made of silicon, germanium, boron, phosphorus, or a combination thereof.

18. The method of claim 10, wherein the blocking layer has a thickness in a range from about 3 nm to about 50 nm.

19. The method of claim 10, wherein the blocking layer is made of silicon nitride.

20. The method of claim 10, wherein the epitaxy is multi-layered.

* * * * *